United States Patent [19]

Freedman et al.

[11] Patent Number: 5,175,410
[45] Date of Patent: Dec. 29, 1992

[54] IC PACKAGE HOLD-DOWN FIXTURE

[75] Inventors: Gary M. Freedman, Stow; Maurice P. Brodeur, Concord, both of Mass.; Peter J. Elmgren, Hampstead, N.H.

[73] Assignee: Digital Equipment Corporation, Maynard, Mass.

[21] Appl. No.: 724,412

[22] Filed: Jun. 28, 1991

[51] Int. Cl.⁵ .............................................. B23K 26/00
[52] U.S. Cl. .................................. 219/121.63; 29/760; 219/121.82
[58] Field of Search ..................... 219/121.63, 121.64, 219/121.82; 29/760; 439/68, 70, 72, 73; 228/6.2, 180.2

[56] References Cited

U.S. PATENT DOCUMENTS

| | | | |
|---|---|---|---|
| 4,000,392 | 12/1976 | Banas et al. | 219/121.85 |
| 4,461,945 | 7/1984 | O'Cheskey et al. | 214/121.63 |
| 4,654,505 | 3/1987 | Sciaky et al. | 219/121.63 |
| 4,697,061 | 9/1987 | Spater et al. | 219/121.64 |
| 4,845,335 | 7/1989 | Andrews et al. | 219/121.63 |
| 4,959,522 | 9/1990 | Rossi | 219/121.63 |
| 4,970,365 | 11/1990 | Chalco | 219/121.63 |
| 4,978,835 | 12/1990 | Luijtjes et al. | 219/121.64 |

OTHER PUBLICATIONS

Japanese Development in TAB Outer Lead Bonding Equipment, dated Apr. 2, 1991, 3 pages.

Primary Examiner—C. L. Albritton
Attorney, Agent, or Firm—William P. Skladony; Ronald E. Myrick; Barry N. Young

[57] ABSTRACT

The present invention involves a hold-down fixture which is usable in connection with bonding an integrated circuit package to a printed circuit board in a surface mount environment. The purpose of the fixture is to hold each of the leads of the package in intimate contact with corresponding contact pads on the printed circuit board during the bonding process. The fixture includes a base with two bars for each group of leads extending from the perimeter of the housing of the package. Together the bars compressively force the entire foot of each lead to set flatly against its pad. The bars are spaced such that an aperture, which is defined by an opening through the base and positioned between the bars, can admit a bonding means, such as a laser beam, to reflow a solder composition at the lead/pad junction. Accordingly, with the leads compressed against the pads by the bars of the fixture, and with the reflow of the solder composition by means of the laser, a good bond between each lead and pad will be formed.

22 Claims, 8 Drawing Sheets

IC PACKAGE HOLD-DOWN FIXTURE

CROSS REFERENCE TO RELATED APPLICATIONS

U.S. patent application no. (PD 91-0177) by Gary Marc Freedman and Peter Jarl Elmgren entitled THROUGH DIELECTRIC LASER BONDING.

FIELD OF THE INVENTION

This invention relates to a fixture which holds the leads extending from an integrated circuit ("IC") package in intimate contact with corresponding contact pads on a printed circuit board while the leads are bonded with the contact pads.

BACKGROUND OF THE INVENTION

Conventional integrated circuit packages are typically made up of a silicon chip packaged in a ceramic or plastic housing. Such packages further typically include a plurality of integrally attached leads extending from the perimeter of the housing. The leads form the physical attachments and conductive paths by which the chip is connected to some higher level assembly, usually a printed circuit board.

Chip-on-tape technology, which is also known as "tape automated bonding", or "TAB", involves a number of modifications to this conventional approach. More particularly, chip-on-tape technology uses IC's which are manufactured without integrally attached leads extending from their perimeter. Rather, the IC package is formed with tiny, contact pads, usually positioned along the perimeter of the underside of the package. Before such a package is integrated into a higher assembly, such as a printed circuit board, each contact pad is bonded to a corresponding conductive lead on a tape lead frame which is configured for having the chip mounted thereon. Once the chip is bonded to the tape, the free ends of the conductive leads on the tape can be bonded to a printed circuit board. Accordingly, the conductive leads on the tape serve as the functional substitutes for the fixed leads integrally formed with the conventionally designed package.

The tape that is used in a chip-on-tape application is often a two sided, flexible connector. On one side is a dielectric film, the appearance of which somewhat resembles the film that goes in an ordinary camera. On the other side, and integrally attached to the film, are the conductive leads which are precisely configured so that one end of each lead mates with one contact pad on an IC, and the other end mates with one contact pad on a printed circuit board. Therefore, once the chip is mounted onto the tape, the chip and tape package must be appropriately placed on the printed circuit board so that each lead can be bonded with its corresponding pad.

There are multiple methods by which an IC package can be surface mounted on a printed circuit board, such as mass reflow, hot bar, single point bonding, and laser bonding. When surface mounting using the laser bonding technique, the IC package, either conventional or TAB, is first positioned on the printed circuit board so that each of the leads is aligned for bonding with a flat surface of its corresponding contact pad on the printed circuit board. After so mounting the package, the lead/pad joint is heated by means of a laser to cause the reflow of a solder composition which subsequently will cool and harden to form a good physical and electrical contact.

An impediment to this type of bonding process is that when the package is surface mounted on the board all of the leads may not make flat, intimate contact with their corresponding pads. Flat, intimate contact is necessary to assure that the leads and pads are physically joined during the laser bonding process. Additionally, such contact enables the laser energy absorbed by the lead to be conducted to the pad resulting in the reflow necessary for bond formation.

In practice, there are a number of reasons why a given lead on a package fails to set flatly against its corresponding contact pad, a condition which will hereinafter be referred to as "non coplanarity" between the lead and pad. For example, during the lead forming process, which is the process in which a straight lead is bent, typically in the shape of a gull wing, the lead formation may not be perfect resulting in non coplanarity. In addition, in some surface mount applications, each pad is covered with a solder dome. If, however, the solder domes are not uniform from pad to pad, this too can cause non coplanarity of some leads and their corresponding pads. Other causes of non coplanarity between leads and pads could be the unevenness of the housing of the package, warpage of the printed circuit board, or component distortion.

One approach to keeping the leads and pads in intimate contact during the laser bonding process is shown in U.S. Pat. No. 4,978,835, issued to Luijtjes, et al. on Dec. 18, 1990. In Luijtjes the first and second contacts (ie. the leads and the pads) are bonded by first aligning the two contacts, placing a diaphragm against the first contact, and then applying a differential pressure to the diaphragm to pull the first contact in the direction of the second contact. Thus, the two contact elements are kept in intimate contact through the pressure applied by the diaphragm, which is made of a glass plate or transparent membrane. According to Luijtjes, the bonding is accomplished by directing a laser beam at the diaphragm overlaying the contacts to cause reflow.

A drawback to the approach shown in Luijtjes, if applied in a bonding process which uses solder flux, is that the diaphragm provides a surface on which the condensates resulting from the bonding process may accumulate. When bonding with a flux, often the flux may vaporize after irradiation by the laser, and the resulting condensates will deposit on the diaphragm. Consequently, during subsequent use the deposits may cause some laser beam attenuation due to refraction, reflection, and absorption. Such beam attenuation introduces additional process variables into the bonding operation which may be undesirable because those variables may impair the reliable formation of a bond.

Another drawback to the approach shown in Luijtjes is that it requires the matching of the optical properties of the diaphragm with the laser beam characteristics, such as wavelength and power density. Without such matching, the diaphragm may be unable to transmit the proper amount of beam energy to cause solder reflow and may be damaged due to its direct optical absorption of the incoming laser beam.

What is needed is a hold-down fixture which maintains the leads in intimate contact with the pads during bonding, and avoids the drawbacks of the prior art.

SUMMARY OF THE INVENTION

This invention relates to a hold-down fixture which can be used in a surface mount environment for keeping the leads of a conventional IC package or a TAB IC package held in intimate contact with their corresponding contact pads during bonding. The fixture is made of a base which includes two bars for each group of leads extending from the housing of the package. One of the two bars is made of a compliant material, such as an elastomeric material.

When the fixture is set against the package, the compliant bar will first make contact with the toe portion of the lead, which is the part of the lead furthest from the package housing. This contact pressure forces the toe of the lead into contact with the contact pad on the printed circuit board. Then, as the fixture moves into closer proximity with the package and the compliant bar compresses, the second bar makes contact with a second part of the lead assuring that the heel of the lead is pressed into contact with the pad. Accordingly, the entire foot of the lead is forced into contact with the pad to which it is to be bonded.

Each set of bars on the fixture are spaced in relation to one another such that they are separated by an aperture which is defined by an opening in the base of the fixture. The aperture is situated such that it is immediately above the foot of each lead which is being held in contact with a corresponding pad by the bars. The aperture provides an opening through which a laser beam can be directed to irradiate the lead/pad junction for reflowing, which will result in a bond formation between each lead and its pad.

An object of the present invention is to provide a hold-down fixture which will assure that all leads on the package are held in intimate contact with their respective pads during bonding. Such contact is to be made and maintained even if some leads and pads are non coplanar when the package is first positioned on the printed circuit. A feature of the fixture is to have the two bars compressively force each lead into contact with its corresponding pad. Another feature of the fixture is that the aperture provides an opening through which a laser can be directed at the lead/pad joint so that the two can be bonded. An advantage of the invention is that bonds between the leads and pads can be reliably formed even when some leads and pads are originally non coplanar. Another advantage is that the opening defined by the aperture does not afford a surface on which condensates may accumulate and affect subsequent laser bonding operations. A further advantage of the invention is that because the aperture is formed by an opening with no surface, such as a diaphragm, it is not necessary to match any diaphragm like material with the characteristics of the laser. Yet further advantages are that the fixture is inexpensive to fabricate and easy to maintain.

Other objects, features, and advantages of the present invention will be further appreciated and better understood on consideration of the detailed description of the preferred embodiment presented below in conjunction with the accompanying drawings.

DETAILED DESCRIPTION OF THE PREFERRED EMBODIMENT

Figure 1:
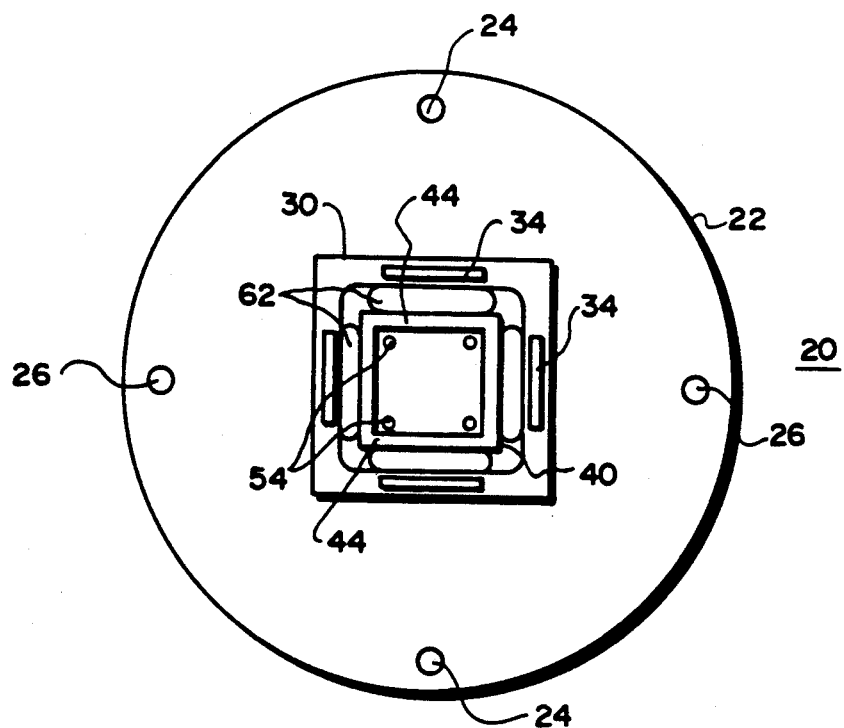
FIG. 1 shows a bottom view of an embodiment of a hold-down fixture in accordance with the present invention.

The hold-down fixture of the present invention can be used when surface mounting IC packages of the conventional or TAB variety. In both instances, the leads that are bonded to the printed circuit board tend to be very tiny and fragile, having a lead pitch on the order of approximately 0.025 inches, or less. Such leads, referred to as "fine pitch" leads, are common on modern IC packages, which may have hundreds of such leads surrounding the package housing. The size and fragile nature of the leads together with the other factors affecting coplanarity between the leads and pads, discussed above, tend to make alignment and contact between the leads and pads during the bonding operation difficult. The fixture of the present invention addresses this difficulty by assuring that once the leads are properly aligned with their respective pads, the leads will be pressed in intimate contact with the pads during the laser bonding operation.

It should be noted that throughout this detailed description a number of references indicating direction—such as top, bottom, downward, and so on—are included. Such references are typically to the orientation of the fixture or the IC package represented in one of the drawings. In the views shown herein, the hold-down fixture is generally positioned on top of the IC package with the package set on top of a printed circuit board generally oriented in a horizontal plane. The invention, however, can be used in other orientations. Accordingly, no directional references should be taken as a limitation of the application of the invention, as the invention is suitable for use in many different physical orientations, and such directional references are for convenience in discussing one embodiment and application of the invention.

Referring to FIGS. 1-4, the features of an embodiment of a hold-down fixture in accordance with the present invention is shown. As seen best in FIGS. 1, 2, and 4, fixture 20 includes disk shaped base 22, which is a generally flat, plate of metal made of aluminum (Al).

Base 22 need not be disk shaped, nor does it necessarily have to be made from aluminum. It is, however, desirable to have base 22 made of a material that has sufficient strength to withstand the forces applied during loading.

Additionally, it is desirable that the material comprising base 22 is sufficiently reflective of the particular wavelength and energy density of the laser used in the bonding process. This assists in shielding the printed circuit board, on which the package is being mounted, from unnecessary laser beam energy. In one application of the present invention, using a Nd:YAG laser which produces a beam having a wavelength of 1.064 micrometers, aluminum has been found to be a suitably durable, reflective, and inexpensive material.

Around the outer perimeter of base 22 are two, identical, oppositely positioned screw holes 24, which are for mounting fixture 20 on a higher level assembly, such as a robotic arm (not shown). Fixture 20 could be so mounted in order to integrate fixture 20 into an automated bonding operation, through which the arm automatically lowers fixture 20 in contact with the package being surface mounted. To further assist with the mating of fixture 20 with the robotic arm, the outer perimeter of base 22 further has two, identical, oppositely positioned pin holes 26, which are configured to register with corresponding pins (not shown) on the robotic arm. With fixture 20 positioned on the arm, the pins would be disposed through pin holes 26 to properly align the two mating elements.

Although one method of mounting fixture 20 on a suitable robotic arm has been detailed, it will be clear that there are other methods of fastening fixture 20 to the arm, such as by using four screws. Any such alternate fastening methods would be suitable provided fixture 20 is firmly attached so that it will not move during operation. In addition, fixture 20 need not be used in an automated bonding operation, rather it can also be manually positioned to perform the hold down function.

Figure 3:
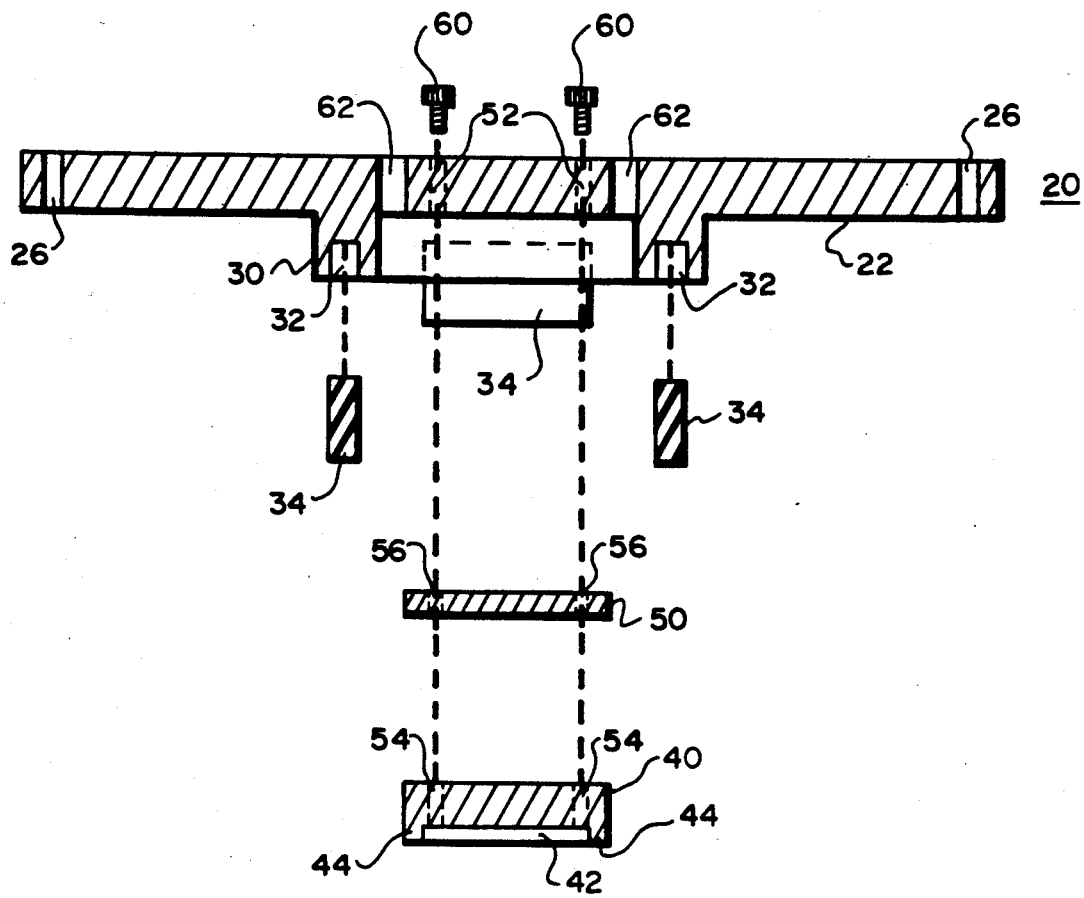
FIG. 3 shows a partly exploded, side sectional view of the embodiment of the hold-down fixture shown in FIG. 2, sectioned along Line 3—3.
Figure 4:
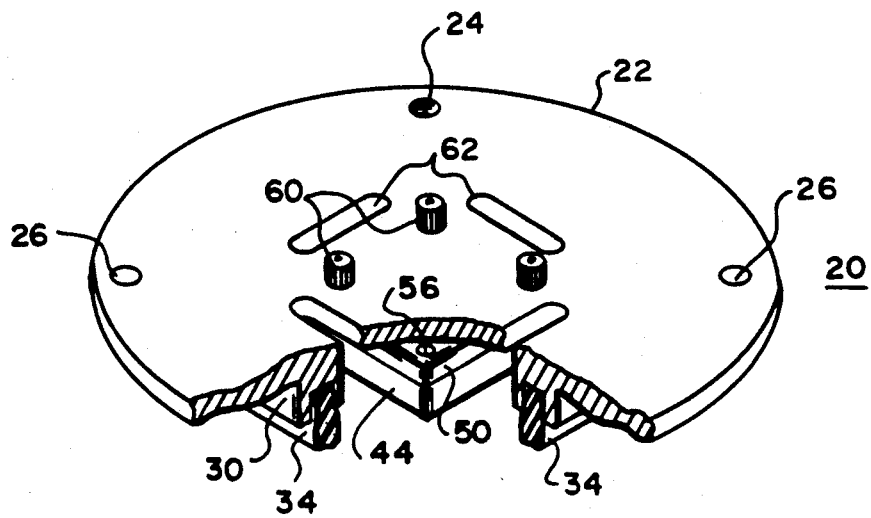
FIG. 4 shows a fragmented, isometric view of the hold-down fixture shown in FIGS. 1-3.

As shown in FIGS. 1, 3, and 4, the bottom side of base 22 includes retention frame 30. Retention frame 30 is integrally formed with base 22 and extends downwardly from base 22, when fixture 20 is oriented over an IC package, as it would be during a laser bonding operation. Retention frame 30 forms a generally rectangular member with four identically configured, recessed slots 32 therein, two of which are clearly seen in FIG. 3.

Referring particularly to FIG. 3, but also seen partially or wholly in FIGS. 1 and 4, mounted in each of slots 32 is one of four, identically configured, outer bars 34. Outer bars 34 are each made of a compliant material, such as an elastomeric material, which has the ability to elastically deform. For example, a silicon rubber material sold by CHR Industries, Inc., of New Haven, CT., under the trademark COHRlastic, number 9050, has proven to be a satisfactory elastomeric material for this application. CHORlastic 9050 has a durometer of 50, as measured on the Shore A scale, and is not adversely affected by temperatures ranging from $-100$ to $+500$ degrees F.

Although CHORlastic 9050 is a satisfactory material for outer bars 34, other materials may be used, provided that the substitute material has a sufficiently low thermal conductivity, and has the characteristics of low optical absorption and/or high reflection of scattered IR radiation at the wavelength of the bonding laser. Although it is preferred that outer bars 34 have a durometer of 50 on the Shore A scale, the durometer may range from 30-70 and still provide satisfactory results. It is also necessary that the material of outer bars 34 must not suffer any permanent deformation after the thermal saturation incurred during the bonding cycle.

As shown in FIG. 3, outer bars 34 are fixed in slots 32 by means of a compression fit, or they can be fixed by means of a suitable bonding agent, such as an adhesive, provided the bonding agent does not deteriorate the material composition of outer bar 34. When so mounted in slots 32, outer bars 34 will downwardly project from the bottom side of fixture 20, as shown in FIG. 4.

Centrally positioned on the bottom side of base 22 is a generally rectangular rigid plate 40, which is also made of aluminum, though it can be made of another IR reflective material. As seen by reference to FIG. 3, plate 40 is formed such that its underside has a central, generally rectangular depression 42.

The central recess formed by depression 42 leaves four, identically configured, and attached inner bars 44. Given that the four inner bars 44 are attached to each other at their ends, when viewed from the bottom, as in FIG. 1, inner bars 44 appear to form a continuous rectangle around the bottom perimeter of plate 40. The inner perimeter of that rectangle is defined by depression 42, and the outer perimeter is defined by the outer dimensions of plate 40. Depression 42 provides a recess into which the housing of the IC package fits, when fixture 20 is positioned on top of it (as seen in FIGS. 6 and 8A-8D).

Each inner bar 44 is configured such that it is parallel to a corresponding outer bar 34, which together define an outer and inner bar set. In addition, inner bars 44 downwardly project from the bottom of base 22; however, when viewed from the side, as in FIGS. 4 and 8A-8D, inner bars 44 do not extend down as far as outer bars 34. In one embodiment of the invention, fixture 20 is configured for use with an IC package having gull wing shaped lead. Consequently, there will be a vertical height difference between different portions of the leads, which is shown on FIG. 8C and defined as "h". In order to accommodate this height variation, outer bar 34 extends downwardly further than inner bar 44, as will be further detailed in connection with the discussion of FIGS. 8A-8D, below.

In addition, in order to make fixture 20 more universally adaptable for use with different types of IC packages having gull wings with different heights, disposed between plate 40 and base 22 is shim 50, shown in FIG. 3. Although other materials could be suitable, shim 50 is a generally flat, rigid, stainless steel member which separates plate 40 from base 22 by a given distance. Given that the distance of downward projection of outer bars 34 is fixed, the relative vertical height difference between inner bars 44 and outer bars 34 can be adjusted to accommodate IC packages by means of inserting one or more shims 50 of the desired thickness to raise or lower inner bars 34.

Figure 2:
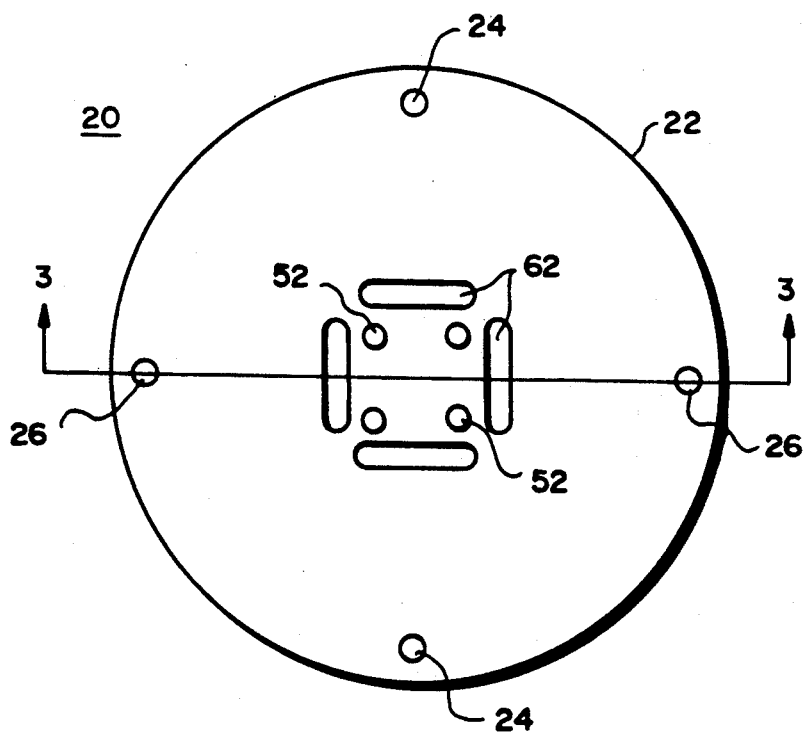
FIG. 2 shows a top view of the embodiment of the hold-down fixture shown in FIG. 1.

As shown on FIGS. 2 and 3, base 22 has four, identical screw holes 52 disposed therethrough. Shown on FIGS. 1 and 3, plate 40 has four, identical, threaded screw holes 54, which correspond to and align with screw holes 52. As shown partially on FIG. 3 and 4, shim 50 also has four, identical screw holes 56, which similarly correspond to and align with screw holes 52, 54. Accordingly, shim 50 and plate 40 are mounted on base 22 by positioning shim 50 between plate 40 and base 22, and then fastening these three elements of fixture 20 together by means of four, identical screws 60, shown on FIGS. 3-5. Other fastening means could be used, however such alternative means should enable the easy substitution of different shims 50.

Disposed through base 22 are four, identically configured elongated apertures 62. As seen most clearly in FIG. 1, each aperture 62 is positioned between and runs generally parallel with a corresponding outer bar 34 and a corresponding inner bar 44. Aperture 62 is configured such that with fixture 20 positioned to hold down the leads of a given IC package by means of bars 34 and 44, aperture 62 provides an opening in base 22 through which a laser beam can be directed onto the lead/pad combination which is being bonded. This interrelationship between bars 34, 44 and aperture 62 is best described by reference to the operation of fixture 20, shown on FIGS. 5 and 6.

Figure 5:
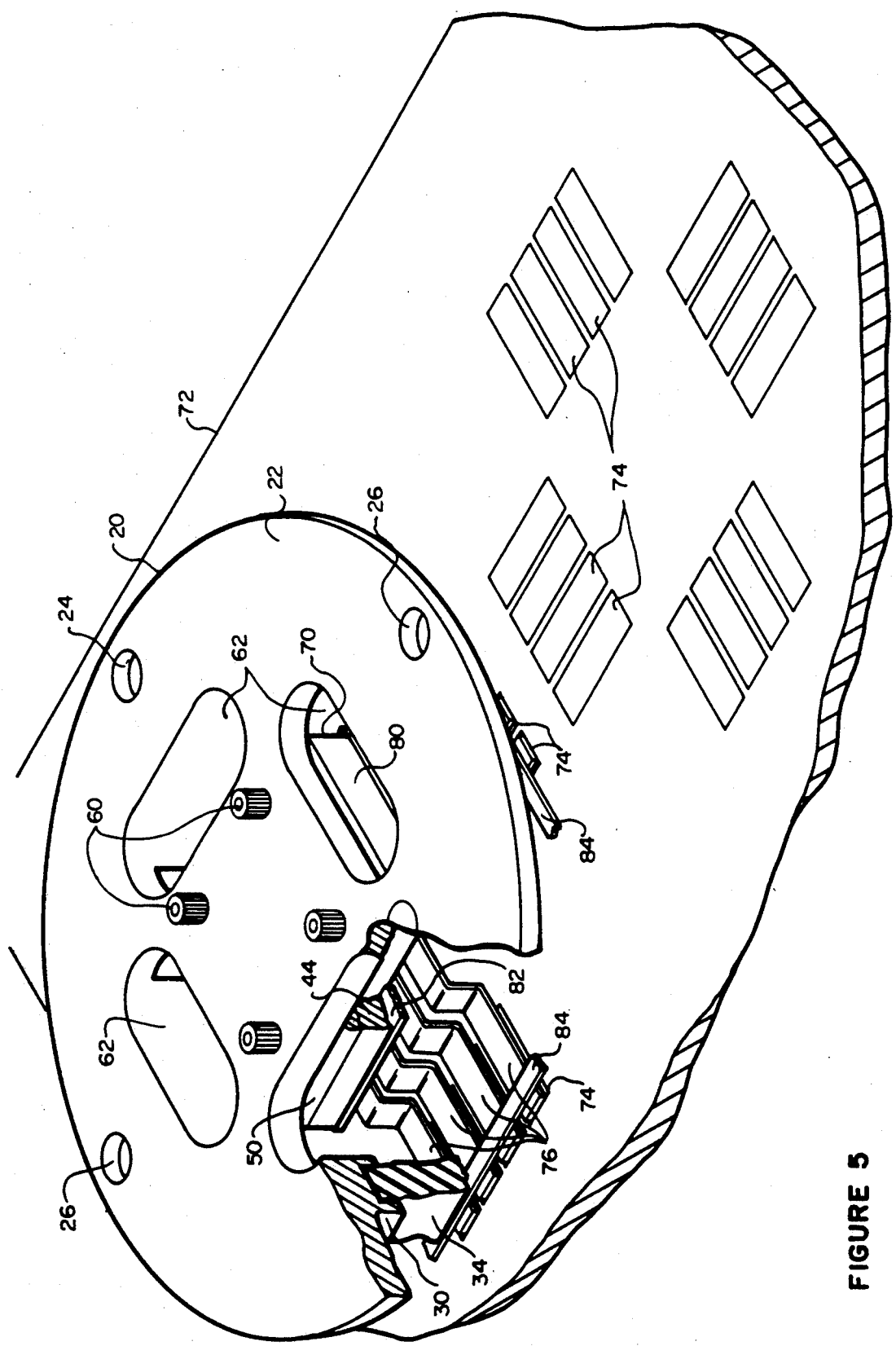
FIG. 5 shows a fragmented, isometric view of an embodiment of the hold-down fixture in accordance with the present invention positioned above an IC package surface mounted on a printed circuit board.

Referring now to FIG. 5, fixture 20 is shown in the environment in which it is used. As seen in FIG. 5, fixture 20 has been set over IC package 70, which could have been done manually, or automatically, such as by means of a robot as discussed above. In the process step shown in FIG. 5, package 70 is being prepared for surface mounting to printed circuit board 72. Board 72, which is shown in fragmentary view, has a plurality of contact pads 74 which are most clearly seen in the corner of the board not covered by package 70 and fixture 20. Pads 74 are the conductive elements by which leads 76 of package 70 are connected to the circuitry of board 72.

In the exemplary configuration shown in FIG. 5, package 70 is a TAB package having a plurality of like configured leads 76 extending outwardly from the periphery of the package housing 80. Each lead 76 is formed, or bent, at two, approximate, right angles so that the bent sections at either end of lead 76 are generally parallel to one another and, when viewed from the side, lead 76 appears to be shaped like a gull wing. In addition, because package 70 is a TAB package, across the top of the leads 76 are two strips of dielectric film, inner strip 82 and outer strip 84 which are parts of the tape with which leads 76 are formed. The tops of strips 82 and 84 form an area of contact by which inner bar 44 and outer bar 34, respectively, contact and hold down leads 76.

Although the exact amount of surface contact between bars 34 and 44 and strips 82 and 84, respectively, can be varied, it is desirable in any given application to configure bars 34 and 44 to maximize the surface contact with strips 82 and 84 so that the downward force of bars 34 and 44 is as evenly and fully distributed as possible. On the other hand, it is also desirable to minimize the extent to which bars 34 and 44 extend past, or overhang, strips 82 and 84 in the direction of the opening formed by aperture 62. Any such extension will narrow the space through which the laser beam can be directed.

Although package 70 is shown to have only four leads 76 per side, it will be known to those skilled in the art that modern IC packages have many more than sixteen leads extending around the housing perimeter, often hundreds. Only four per side are shown so that the features of leads 76 and fixture 20 can be shown in exaggerated view for purposes of drawing clarity. The present invention, however, is suitable for use with packages having any number of leads.

With a conventionally designed IC package, having leads integrally formed with the package housing, fixture 20 would be used to hold down the leads in the same manner except that bars 34 and 44 would not engage a dielectric strip. Rather, bars 34 and 44 would directly engage the top surfaces of the leads. Otherwise, fixture 20 would operate in the same manner as described herein, and the explanation of the operation of fixture 20 with respect to a TAB package applies equally to the operation of fixture 20 with respect to a conventional IC package.

In the TAB configuration shown in FIG. 5, individual conductive pads (not shown on FIG. 5, but shown as reference number 100 on FIGS. 8A-8D) on the underside of housing 80 of package 70 are bonded to the inner portion of individual, corresponding leads 76. Such bonding would have taken place prior to the time that the outer portion of leads 76 are bonded to pads 74, which is the bonding process reflected on this embodiment of the present invention.

As shown in FIG. 5, when fixture 20 is set on top of package 70, leads 76 will be compressively forced into intimate engagement with their corresponding contact pads 74. As a result of that compressive force, leads 76 are forced flatly against pads 74, so that a sound bond may be formed when the lead 76/pad 74 joint is irradiated by a laser.

As shown most clearly by the cut away section of fixture 20 in FIG. 5, each aperture 62 is situated so that it is generally above that portion of each lead 76 which is in forced, intimate contact with its corresponding pad 74. Accordingly, aperture 62 affords an opening through which a laser beam (shown in FIG. 6) can be directed for the purpose of irradiating leads 76. Apertures 62 are configured so that they are wide enough and long enough so that the portion of the lead which makes contact with the pad is at least partly exposed for laser irradiation.

Figure 6:
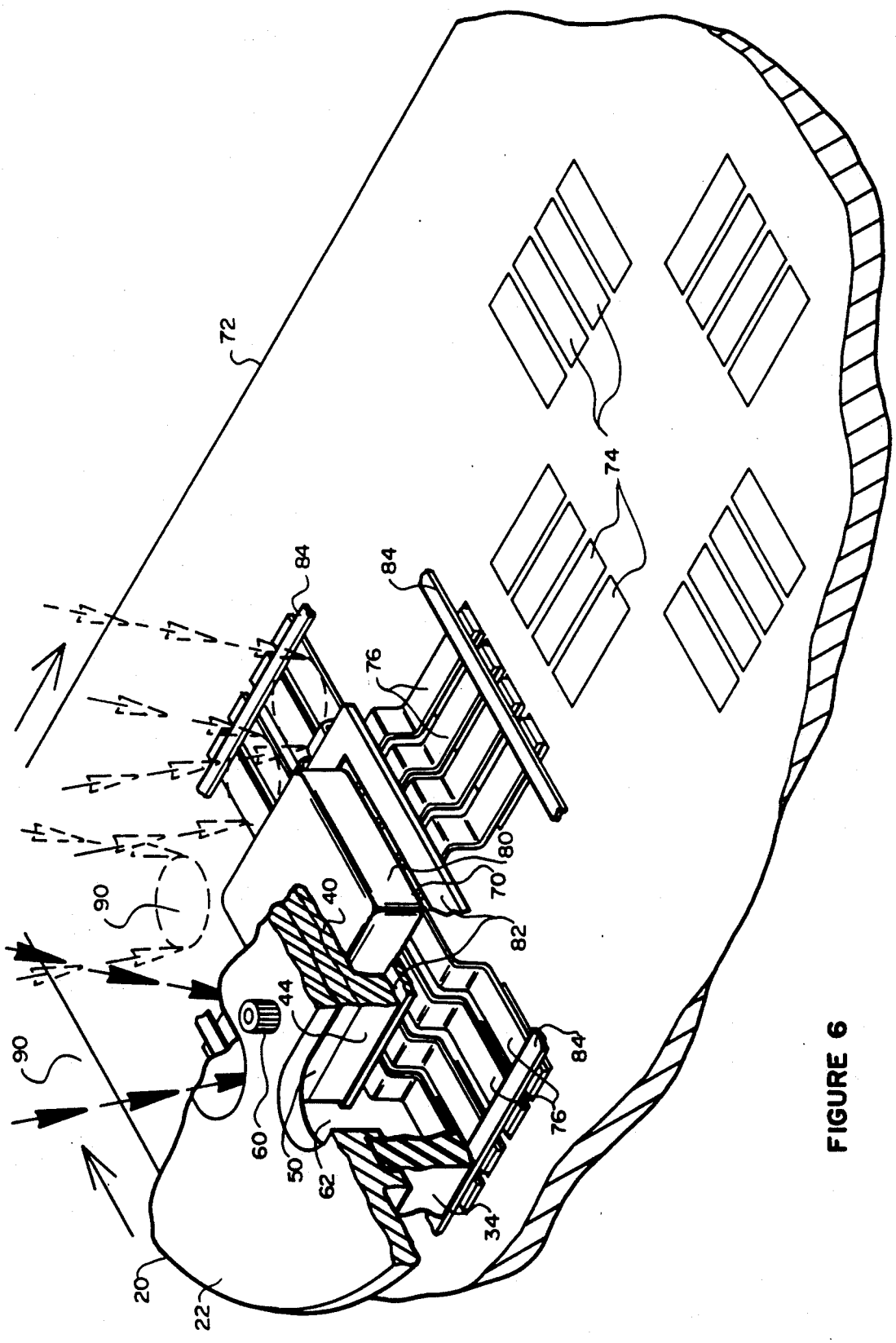
FIG. 6 shows the same view of the hold-down fixture shown in FIG. 5, except that a greater portion of the fixture has been sectioned away to show the portions of the lead/pad combinations irradiated by a laser.

Referring now to FIG. 6, the same view of fixture 20 as provided in FIG. 5 is shown except that a much greater portion of fixture 20 has been sectioned away. This is to show the otherwise hidden portions of package 70, and to show how laser beam 90 is positioned and moves relative to aperture 62 and the leads 76/pads 74 joint. As seen in FIG. 6, leads 76 are held in intimate contact with their respective pads 74 by the compressive force exerted by outer bar 34 and inner bar 44 on the top surface of inner strip 82 and outer strip 84.

With leads 76 held flatly and securely against pads 74, laser beam 90 will move in relation to package 70 such that beam 90 will irradiate all of the lead 76/pad 74 joints. Such irradiation could also be accomplished by moving board 72, in relation to a fixed laser beam by means of an x-y platform. Although in FIG. 6 beam 90 is shown to sweep around package 70 with the beam continually on, it is also possible to use the fixture of the present invention with a pulsing laser beam that turns on and off to effectively irradiate one lead at a time.

Aperture 62 provides the opening in base 22 through which laser beam 90 is directed. Aperture 62 must be generally above that portion of the lead 76/pad 74 joint which is irradiated by beam 90. Moreover, because aperture 62 is formed by an opening in base 22, any condensates resulting from the bonding process will not have a surface on which to collect that could affect subsequent laser beam transmission when fixture 20 is next used on a different IC package. In addition, because aperture 62 is an opening, and the means by which leads 76 are held down is outer bar 34 and inner bar 44, instead of a diaphragm as shown in Luijtjes, there is no need to match the characteristics of laser 90 with the material of a diaphragm.

Referring now to FIGS. 7A-7E, a sequence of drawings is provided showing the ability of fixture 20 to compress leads 76 into intimate contact with pads 74 even though the leads 76 and pads 74 may have been non coplanar when package 70 was originally mounted on board 72. The sequence shows several stages of a laser bonding process through which the leads of an IC package are surface mounted on corresponding contact pads 74 on a printed circuit board 72.

FIGS. 7A-7E further include a spring analog, generally designated 92 and enclosed in a dashed box. This analog is not part of the embodiment of the present invention; however, it is included to show the dynamic compliance capabilities of outer bar 34 during a laser soldering operation. The individual springs, 92a-92d, are intended to represent the compressive state of that portion of outer bar 34 generally positioned above a given spring in the given Figure.

Also, although FIGS. 7A-7E, as well as FIGS. 8A-8D, focus upon only one set of inner and outer bars, given that all four sets of bars are identical, the operational description of one set is equally applicable to the others.

Figure 7A:
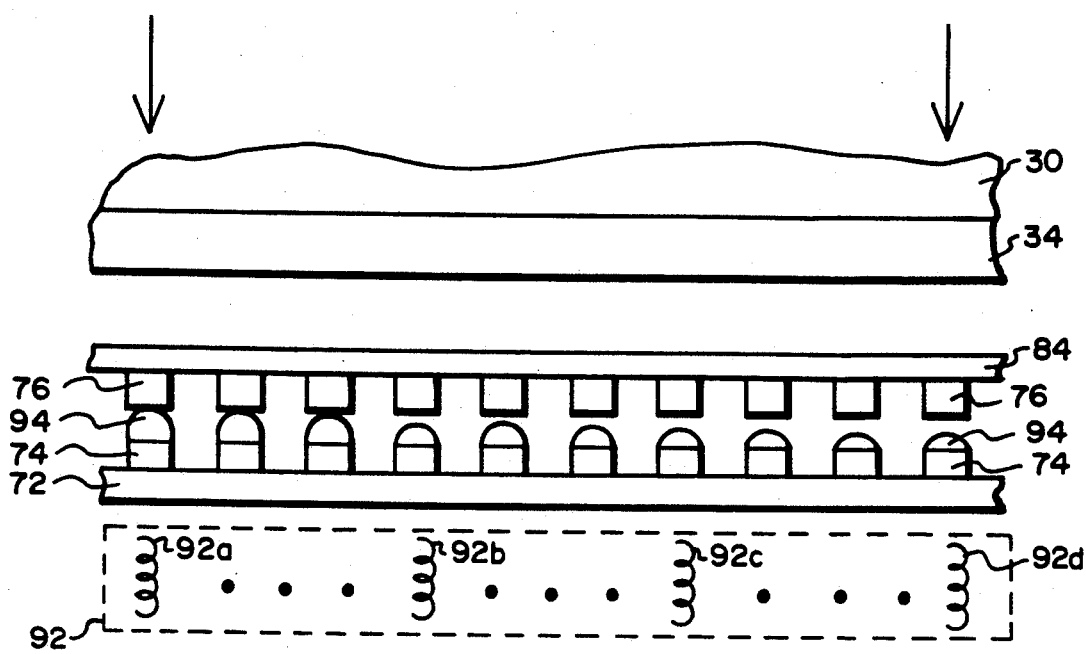
FIGS. 7A-7E are a sequence of drawings showing a fragmented, side view of the compliant bar of the hold-down fixture compressing a plurality of leads over a plurality of uneven solder domes as the solder domes are made to reflow after irradiation by a moving laser beam.

At the process stage shown in FIG. 7A, an IC package 70, such as the one shown in FIGS. 5 and 6, has been positioned on board 72 such that leads 76 are aligned with pads 74. FIG. 7A is a fragmented, side view showing retention frame 30 and outer bar 34 positioned above a fragmented, side view of a plurality of leads 76 covered by outer strip 84. Each lead 76 corresponds to a single pad 74, which has a solder dome 94 formed on its top surface. Not all of the solder domes 94 are uniformly formed, resulting in some being larger than others. Due to the uneven solder domes and due to the connection of leads 76 to one another through outer strip 84, not all leads 76 make contact with their corresponding pads 74, and some pairs of leads 76 and pads 74 are therefore non coplanar. Such non coplanarity does occur during surface mounting operations, and if those leads 76 and their corresponding pads 74 were left separated during laser irradiation, a sound bond might not be formed between them. As suggested by the direction arrows in FIG. 7A, outer bar 34 is in the process of being lowered onto the top of outer strip 84, resulting from the placement of fixture 20 over package 70.

Figure 7B:
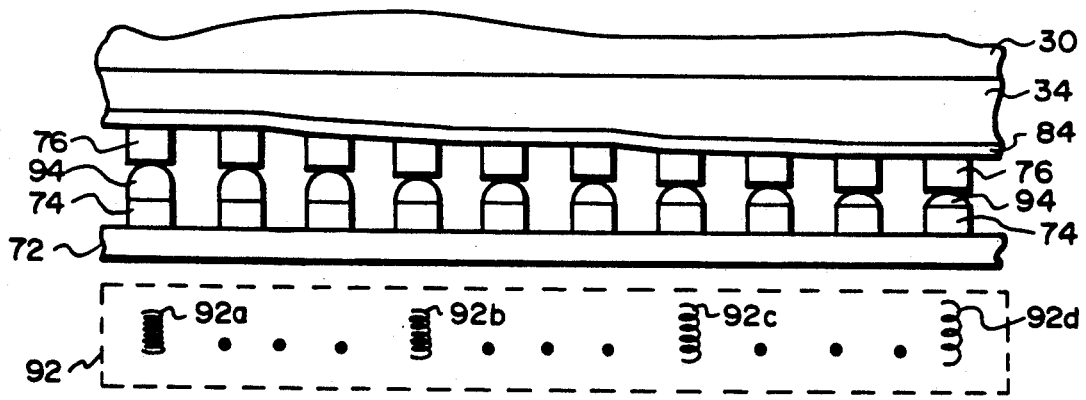

At the process stage shown in FIG. 7B, the downward movement indicated in FIG. 7A has been completed and outer bar 34 has been lowered onto the top of outer strip 84 so that outer bar 34 applies pressure to the group of adjoining leads 76. Due to the compliant characteristics of outer bar 34, it is able to elastically compress above those solder domes 94 which are larger, and compress somewhat less above those that are smaller. Consequently, each lead 76 has been compressively forced into contact with the top of its corresponding solder dome 94. As indicated by the spring analog 92 shown below the leads 76/pads 74 combinations, outer bar 34 is compressed most above the larger solder domes. Specifically, springs 92a and 92b are shown to be tightly compressed, while springs 92c and 92d are compressed less tightly.

Figure 7C:
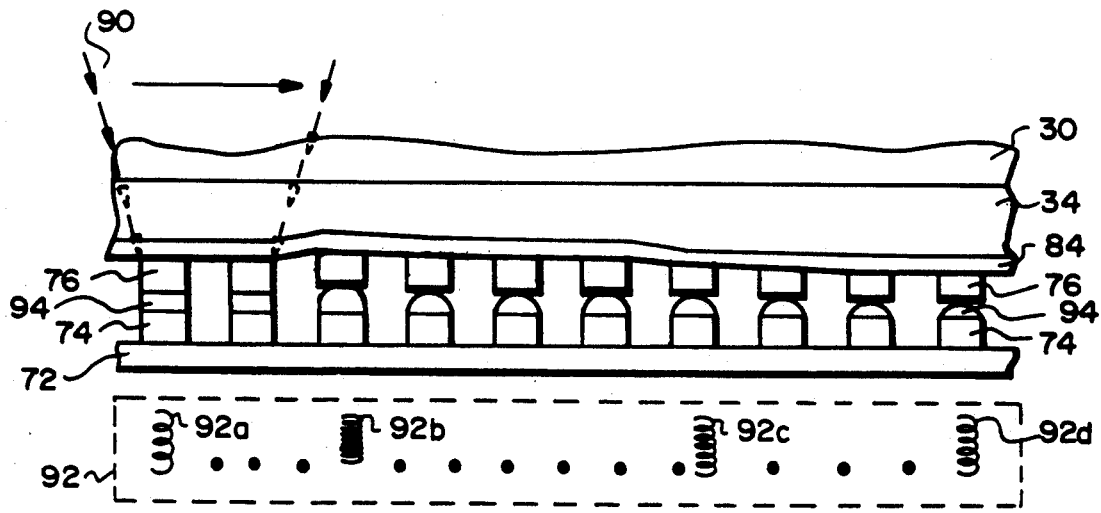

Referring now to FIG. 7C, at this stage of the process, laser beam 90 has commenced irradiating the lead 76/pad 74 joints. It should be noted that although in the two dimensional representation of FIG. 7C it appears that laser beam 90 is passing through retention frame 30 and outer bar 34, it is actually being directed through aperture 62 behind frame 30 and bar 34, as shown in FIG. 6.

Due to its absorption of the beam energy, lead 76 will heat the adjacent solder domes 94 causing them to reflow. As the solder liquifies, leads 76 move closer to their respective pads 74 and the shape and compressive force of the adjacent portion of outer bar 34 changes. Namely, outer bar 34 will elastically expand and assume a shape closer to its original shape, as indicated by the corresponding extension of analog spring 92a. Outer bar 34 will remain somewhat compressed until fixture 20 is lifted away from package 70.

Figure 7D:
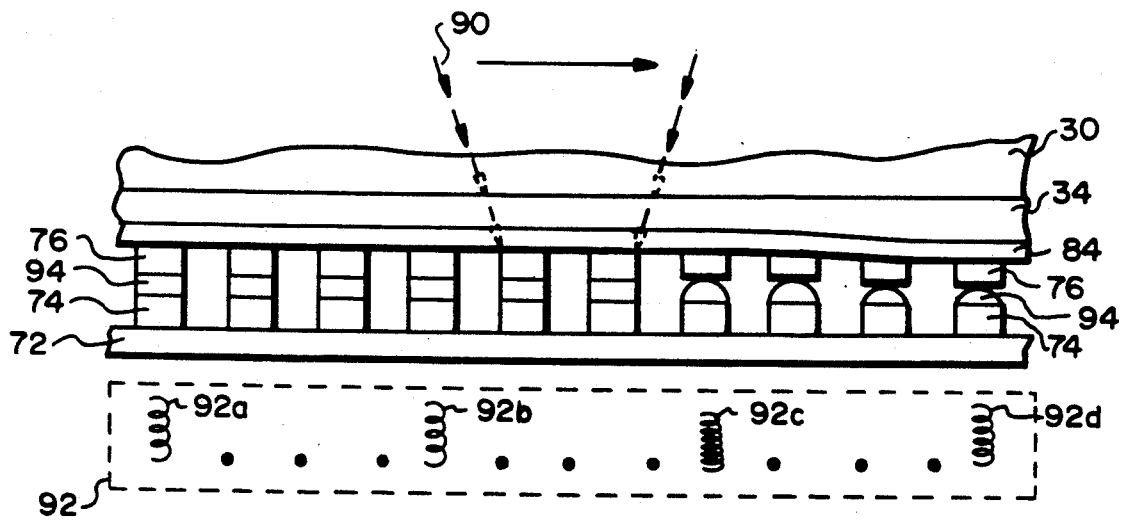
Figure 7E:
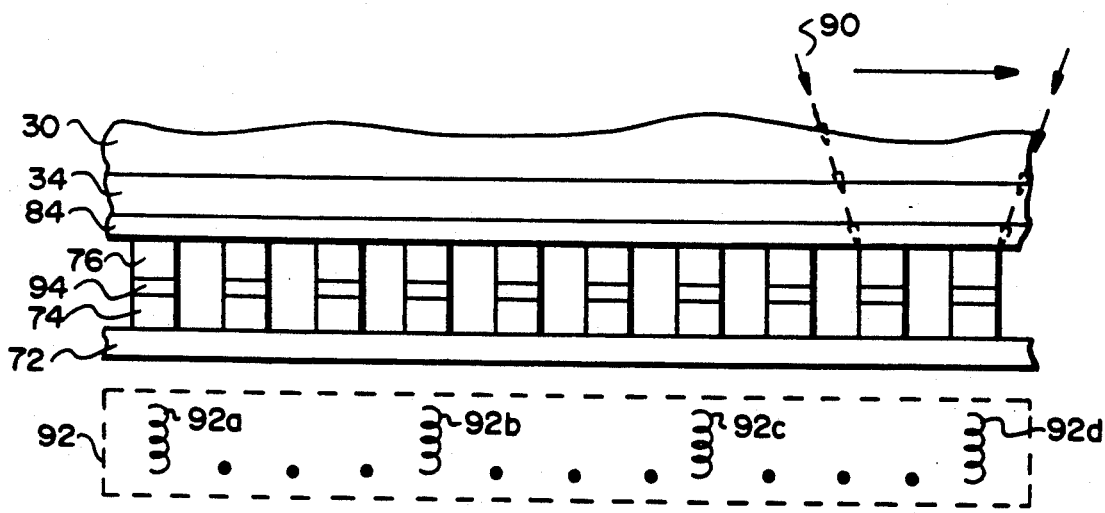

At the stages of the bonding process shown in FIGS. 7D and 7E, laser beam 90 has continued to sweep along the lead 76/pad 74 combinations, causing the other solder domes 94 to reflow. During that progression, the solder domes will likewise reflow and outer bar 34 will be less compressed, as reflected in the extension of springs 92b and 92c.

Therefore, as shown by the sequence in FIGS. 7A-7E, although some pads 74 and leads 76 were originally non coplanar when package 70 was first surface mounted on board 72, fixture 20 will still assure that each lead 76 is held in intimate contact with its corresponding contact pad 74 during the bonding process.

Referring now to FIGS. 8A-8D, another sequence of drawings are provided to illustrate how fixture 20 forces the full "foot" of a deformed lead 76 into intimate contact with its corresponding contact pad 74 prior to bonding. FIGS. 8A-8D are fragmented, side sectional views of outer bar 34 and inner bar 44. At the stage of the process shown in FIG. 8A, fixture 20 is being lowered on top of package 70 as indicated by the downward arrows; however, outer bar 34 and inner bar 44 have not yet made contact with the top surfaces of outer strip 84 and inner strip 82, respectively.

Also shown in fragmented, side sectional view is package 70, which is being surface mounted on printed circuit board 72. Again, the configuration illustrated is a TAB package, although fixture 20 of the present invention would work in the same manner described herein if package 70 were a conventionally designed IC package.

Figure 8A:
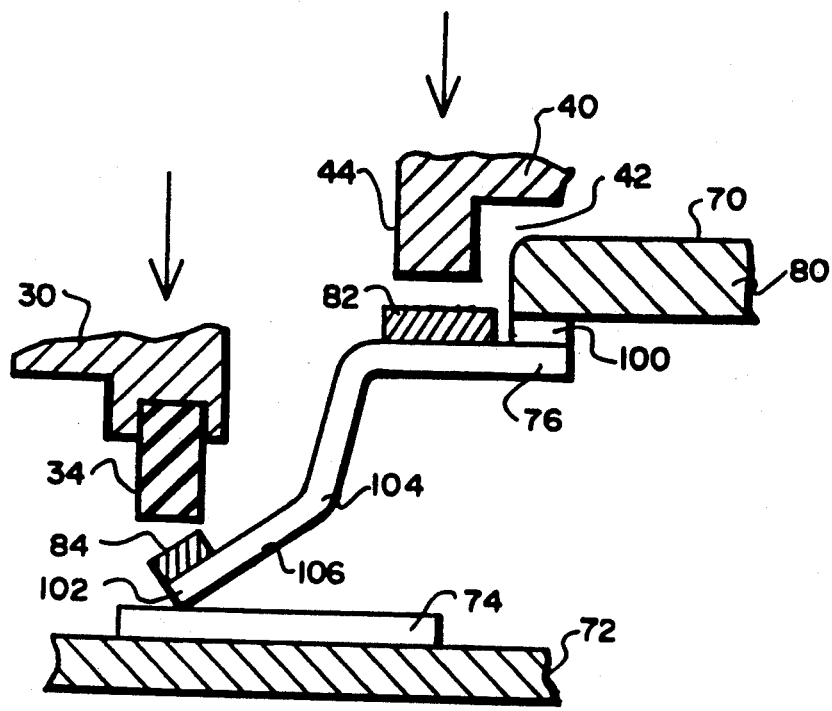
FIGS. 8A-8D are a sequence of drawings showing a fragmented, side sectional view of the compliant bar and the second bar of the hold-down fixture compressing a deformed lead into intimate contact with a contact pad.

Housing 80 has a plurality of package pads 100 on the perimeter of its underside; however, only one is shown in FIGS. 8A-8D. The inner portion of lead 76 has been bonded with package pad 100 prior to the time that package 70 has been positioned and aligned on top of board 72, as shown in FIG. 8A. In addition, lead 76 has inner strip 82 and outer strip 84, which are each a dielectric coating covering the tops of the leads 76. Unlike the pads 74 in FIGS. 7A-7E, which were shown having a solder dome 94, the pads 74 shown in FIGS. 8A-8D have a solder coating, such as tin, or a tin/lead composition, which can be made to reflow when heated. In another application of the invention, the pads 74 in FIGS. 8A-8D could have been shown with solder domes.

The side views of FIGS. 8A-8D show lead 76 to be bent generally in the shape of a gull wing, albeit the lower portion of the lead 76 is somewhat deformed because it is not precisely bent at 90 degrees. As shown on FIG. 8C, when fixture 20 is set against package 70, the intended shape of the gull wing will be established, and consequently the precise height difference between the generally parallel, bent portions of the leads can be seen. In particular, that height difference, "h", is defined to be the distance between the top contact surface of outer strip 84 and the top contact surface of inner strip 82. In other applications of the invention, if the leads had no dielectric coating, the distance would simply be measured from the tops of the corresponding portions of the leads.

Also in another application, if fixture 20 were being used to hold down a package which has gull wing shaped leads with a different height, the relative height of outer bar 34 and inner bar 44 could be adjusted. As discussed above, this is accomplished by inserting one or more shims 50, shown in FIGS. 3-4, of the desired thickness to raise or lower the vertical distance separating the bottom contact surface of outer bar 34 and inner bar 44.

Referring now to FIG. 8A, when package 70 is set on board 72, due to the deformation of lead 76, lead 76 does not set flatly against contact pad 74. More particularly, although toe 102 is touching contact pad 74, heel 104 is raised above pad 74 such that a substantial portion of foot 106 is out of contact with pad 74. If the lead 76/pad 74 combination were exposed to a laser soldering process as they are shown in FIG. 8A, a good bond may not be formed as a result of the inadequate physical contact between foot 106 and pad 74. Indeed, because lead 76 would be unable to transfer any significant amount of laser energy to pad 74, due to their relatively minor physical connection, lead 76 may be physically damaged during laser irradiation as a result of over heating due to the inability of lead 76 to dissipate the energy imparted by the laser into an adjoining pad 74 and board 72.

Figure 8B:
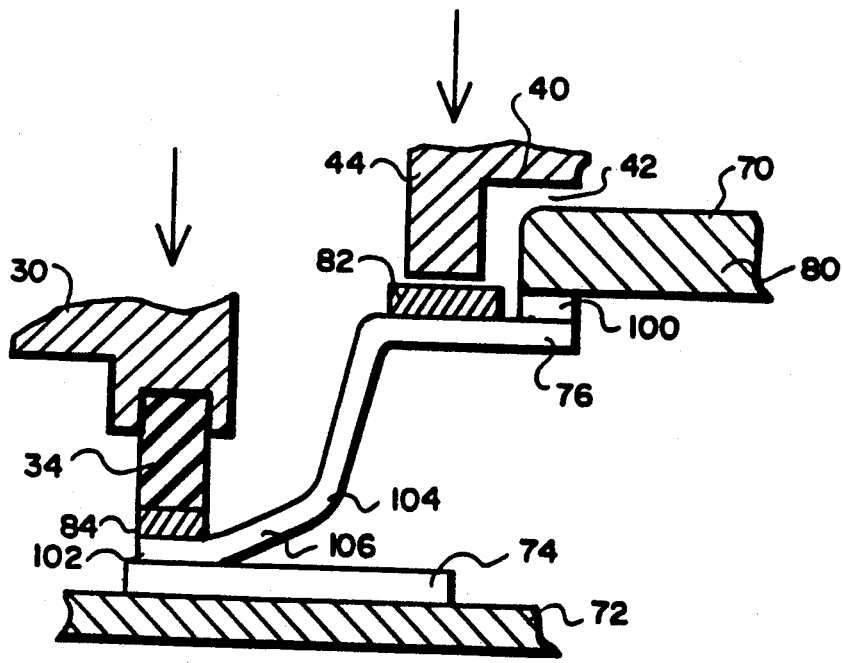

In FIG. 8B, outer bar 34 has made contact with the top side of outer strip 84 such that it is compressively forcing toe 102 of lead 76 into contact with pad 74. In the meanwhile, inner bar 4 has moved closer, but has not yet made contact with inner strip 82, and heel 104 of lead 76 is still physically separated from pad 74.

Figure 8C:
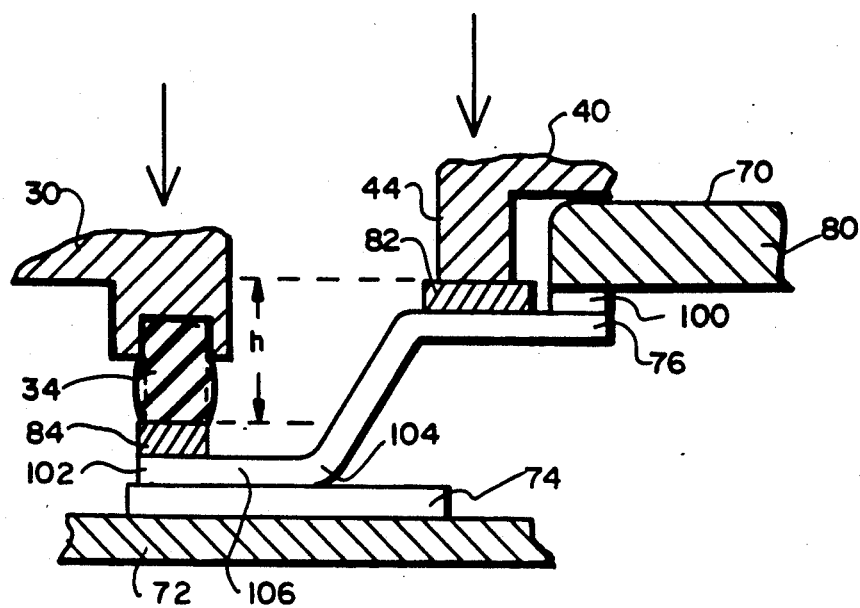
Figure 8D:
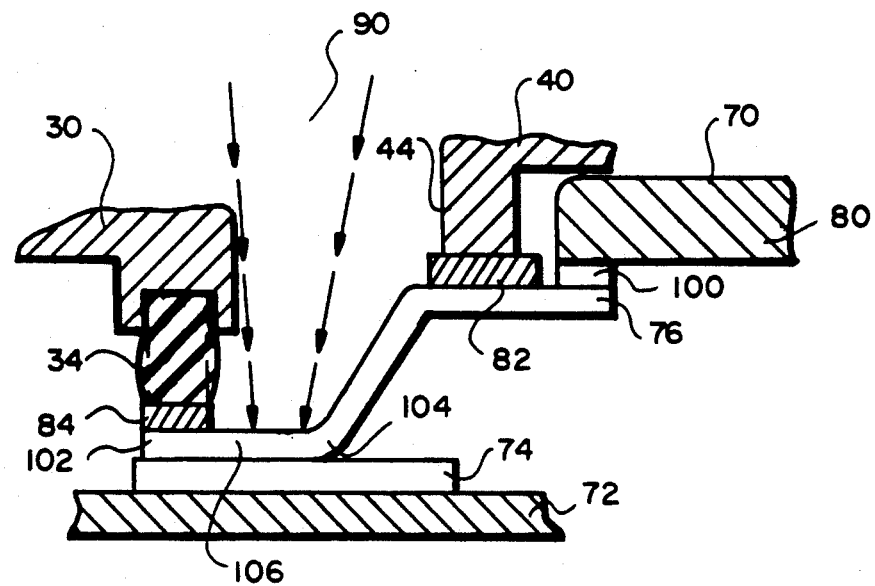

As fixture 20 is lowered into closer physical proximity with package 70, as shown in FIG. 8C, outer bar 34 has been compressed to the point that it is elastically deforming. Such deformation is indicated by the bulging of the sides of outer bar 34. In addition, at this stage inner bar 44 has made full contact with inner strip 82. With toe 102 compressively forced in contact with pad 74, as inner bar 44 pushes the top of lead 76 downward, heel 104 will have a tendency to bend and set flatly on top of pad 74. Consequently, the full foot 106 sets flatly against pad 74, such that when the lead 76/pad 74 junction is irradiated by laser beam 90, as shown in FIG. 8D, a good bond will be formed.

Although the embodiment detailed herein has focused upon packages having leads which are formed into the shape of a gull wing, the invention has broader application. In particular, the invention can be applied to packages which have unformed leads, in which the two sets of hold-down bars would contact different portions of the straight leads. The contact bars would still be separated by an aperture through which the a laser beam can be directed. In addition, it is also possible to configure the inner hold-down bar such that it is made out of a compliant, elastomeric material, provided the material is hard enough to push the top portion of the lead in the direction of the printed circuit board so that the foot of the lead is held in intimate contact with the pad.

Accordingly, the invention in its broader aspects is therefore not limited to the specific details, representative apparatus, illustrative examples shown and described. Thus, departures may be made from such details without departing from the spirit or scope of the invention.

What is claimed is:

1. An apparatus for holding a first electrically conductive element in contact with a second electrically conductive element while said first and second elements are being bonded, said apparatus comprising:
    a base means having an aperture therethrough;
    a first hold-down means, said first hold-down means adjoining said base means and being made of a compliant material such that it is capable of elastically deforming with said first hold-down means in compressive force contact with a first portion of said first, conductive element; and
    a second hold-down means, said second hold-down means adjoining said base means and being spaced in relation to said first hold-down means such that said aperture is positioned between said first and second hold-down means, said second hold-down means being positioned on said base such that with said first hold-down means in compressive force contact with said first portion of said first conductive element, said second hold-down means compressively engages a second portion of said first conductive element, said compressive force of said first and second hold-down members thereby holding said first and second conductive elements in intimate contact for bonding.

2. An apparatus as in claim 1, wherein said aperture is positioned such that with said first and second conductive elements held in intimate contact, said aperture exposes a portion of said first conductive element which is in contact with said second conductive element.

3. An apparatus as in claim 1, wherein said first and second hold-down means are comprised of a first and second bar, respectively.

4. An apparatus as in claim 3, wherein said first bar is comprised of an elastomeric material having a durometer between 30-70 on the Shore A scale.

5. An apparatus as in claim 1, further comprising an adjustment means for adjusting the relative height between said first and second bars, said adjustment means adjoining said base means.

6. An apparatus for holding a lead of an integrated circuit package in intimate contact with a corresponding contact pad while said lead and pad are being bonded by a bonding means to said pad, said apparatus comprising:
    a base means having an aperture therethrough;
    a first hold-down means, said first hold-down means adjoining said base means and being made of a compliant material such that it is capable of elastically deforming with said first hold-down means in compressive force contact with a first portion of said lead; and
    a second hold-down means, said second hold-down means adjoining said base means and being spaced in relation to said first hold-down means such that said aperture is positioned between said first and second hold-down means, said second hold-down means being positioned on said base such that with said first hold-down means in compressive force contact with said first portion of said lead, said second hold-down means compressively engages a second portion of said lead, said compressive force of said first and second hold-down members thereby holding said lead and pad in intimate contact for bonding.

7. An apparatus as in claim 6, wherein said aperture is positioned such that with said lead and pad held in intimate contact, said aperture exposes a portion of said lead which is in contact with said pad.

8. An apparatus as in claim 6, wherein said first and second hold-down means are comprised of a first and second bar, respectively.

9. An apparatus as in claim 8, wherein said first bar is comprised of an elastomeric material having a durometer between 30–70 on the Shore A scale.

10. An apparatus as in claim 6, further comprising an adjustment means for adjusting the relative height between said first and second bars, said adjustment means adjoining said base means.

11. An apparatus for holding a plurality of leads of an integrated circuit package in intimate contact with a plurality of corresponding contact pads while said leads and pads are being bonded by a bonding means, said leads each having a first and second bent portion, said first and second bent portions being generally parallel to one another such that said first and second bent portions are separated by a given distance "h", said apparatus comprising:
 a base means having an aperture therethrough;
 a first hold-down means, said first hold-down means adjoining said base means and being made of a compliant material such that it is capable of elastically deforming with said first hold-down means in compressive force contact with said first bent portions of said leads; and
 a second hold-down means, said second hold-down means adjoining said base means and being spaced in relation to said first hold-down means such that said aperture is positioned between said first and second hold-down means, said second hold-down means being positioned on said base such that with said first hold-down means in compressive force contact with said first bent portions of said leads, said second hold-down means compressively engages said second bent portions of said leads, said compressive force of said first and second hold-down members thereby holding corresponding leads and pads in intimate contact for bonding.

12. An apparatus as in claim 11, wherein said aperture is positioned such that with said leads and pads held in intimate contact, said aperture exposes a portion of each of said leads which is in contact with each of said corresponding pads.

13. An apparatus as in claim 12, wherein said first and second hold-down means each has a respective contact surface, and said contact surface of said first hold-down means has a height difference relative to said contact surface of said second hold-down means equal to "h".

14. An apparatus as in claim 11, wherein said first and second hold-down means are comprised of a first and second bar, respectively.

15. An apparatus as in claim 14, wherein said first bar is comprised of an elastomeric material having a durometer between 30–70 on the Shore A scale.

16. An apparatus as in claim 11, further comprising an adjustment means for adjusting the relative height between said first and second bars, said adjustment means adjoining said base means.

17. An apparatus as in claim 16, wherein said adjustment means comprises a shim.

18. An apparatus as in claim 11, wherein said bonding is accomplished by means of a laser, and said first hold-down means comprises a material which is coupled with the characteristics of said laser such that said laser does not damage said first hold-down means in operation.

19. A method for bonding a first electrically conductive element to a second electrically conductive element, said method comprising the steps of:
 aligning said first conductive element with said second conductive element;
 compressively forcing a first portion of said first conductive element into contact with said second conductive element, by means of a first hold-down means having the ability to elastically deform under said compressive force;
 compressively forcing a second portion of said first conductive element in the direction of said second conductive element by means of a second hold-down means, said compressive force of said first and second hold-down members holding said first conductive element in intimate contact with said second conductive element; and
 heating said first and second conductive elements with a bonding means.

20. A method for bonding each of a plurality of leads on an integrated circuit package to a plurality of contact pads, such that each lead corresponds to one pad, said leads each having a first and second bent portion, said first and second bent portions being generally parallel to one another, said method comprising the steps of:
 aligning said first bent portion of each of said leads with its corresponding pad;
 compressively forcing said first bent portion of each of said leads into contact with its corresponding pad, by means of a first hold-down means having the ability to elastically deform under said compressive force;
 compressively forcing said second bent portion of each of said leads in the direction of its corresponding pad by means of a second hold-down means, said compressive force of said first and second hold-down means holding said first bent portion of each of said leads in contact with its corresponding pad; and
 heating said lead/pad combinations through a bonding means.

21. The method as in claim 20, wherein said bonding means is a laser beam, and said beam is directed to said lead/pad combinations by passing said beam between said first and second hold-down means.

22. The method as in claim 21, wherein said first hold-down means comprises a material which is coupled with the characteristics of said laser such that said laser does not damage said first hold-down means in operation.

* * * * *